United States Patent
Umeda

(10) Patent No.: US 9,842,943 B2
(45) Date of Patent: Dec. 12, 2017

(54) METHOD FOR MANUFACTURING SEMICONDUCTOR DEVICE

(71) Applicant: RENESAS ELECTRONICS CORPORATION, Tokyo (JP)

(72) Inventor: Daisuke Umeda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/243,068

(22) Filed: Aug. 22, 2016

(65) Prior Publication Data

US 2017/0062207 A1 Mar. 2, 2017

(30) Foreign Application Priority Data

Aug. 25, 2015 (JP) ................. 2015-165697

(51) Int. Cl.
| | |
|---|---|
| *H01L 21/31* | (2006.01) |
| *H01L 21/30* | (2006.01) |
| *H01L 21/82* | (2006.01) |
| *H01L 21/46* | (2006.01) |
| *H01L 29/788* | (2006.01) |
| *H01L 21/3105* | (2006.01) |
| *H01L 21/321* | (2006.01) |

(52) U.S. Cl.
CPC ...... *H01L 29/788* (2013.01); *H01L 21/31055* (2013.01); *H01L 21/32115* (2013.01)

(58) Field of Classification Search
CPC ......... H01L 21/02; H01L 21/03; H01L 21/31; H01L 29/07; H01L 21/30; H01L 29/78; H01L 21/46

USPC .......... 438/778, 211, 201, 780, 667; 257/E21.001, E21.662, 40, 321, 741

See application file for complete search history.

(56) References Cited

U.S. PATENT DOCUMENTS

| | | | |
|---|---|---|---|
| 6,569,742 B1* | 5/2003 | Taniguchi | ....... H01L 21/823418 257/E21.619 |
| 2004/0065917 A1 | 4/2004 | Fan et al. | |
| 2005/0124173 A1* | 6/2005 | Matsui | .................. G02B 6/136 438/780 |
| 2007/0207575 A1* | 9/2007 | Taniguchi | ....... H01L 21/823462 438/199 |

(Continued)

FOREIGN PATENT DOCUMENTS

JP 2010-245160 A 10/2010

*Primary Examiner* — Sheikh Maruf
(74) *Attorney, Agent, or Firm* — McDermott Will & Emery LLP

(57) ABSTRACT

Provided is a method for manufacturing a semiconductor device including a film to be treated having a high flatness. A semiconductor substrate having a surface and including a first region and a second region on the surface is prepared, the first region being a region in which a plurality of first level difference portions are formed, the second region being a region in which a plurality of second level difference portions arranged more sparsely than the plurality of first level difference portions are formed, or a region in which no level difference portion is formed. A photosensitive film is formed on a portion of the second region to surround a periphery of the first region as seen in plan view. An applied film having flowability is formed to cover the first region and the photosensitive film. A portion of the applied film at least on the first region is removed.

11 Claims, 11 Drawing Sheets

(56) References Cited

U.S. PATENT DOCUMENTS

| | | | | |
|---|---|---|---|---|
| 2008/0283900 | A1* | 11/2008 | Nakagawa | H01L 27/105 257/321 |
| 2009/0008690 | A1* | 1/2009 | Shiba | H01L 27/105 257/298 |
| 2009/0026634 | A1* | 1/2009 | Sakurai | H01L 24/10 257/778 |
| 2009/0072274 | A1* | 3/2009 | Knoefler | H01L 27/11573 257/204 |
| 2009/0189150 | A1* | 7/2009 | Lee | C08G 61/123 257/40 |
| 2010/0255647 | A1 | 10/2010 | Yamakoshi et al. | |
| 2010/0304570 | A1* | 12/2010 | Horie | H01L 21/30621 438/710 |
| 2011/0121276 | A1* | 5/2011 | Hayashi | H01L 51/5246 257/40 |
| 2012/0086008 | A1* | 4/2012 | Oseki | H01L 29/41725 257/57 |
| 2013/0063917 | A1* | 3/2013 | Choi | H05K 3/3452 361/771 |
| 2014/0034125 | A1* | 2/2014 | Pernel | H01L 31/022425 136/256 |
| 2015/0104738 | A1* | 4/2015 | Takagi | G03G 5/14773 430/56 |
| 2016/0271949 | A1* | 9/2016 | Yamamuro | B41J 2/1603 |

* cited by examiner

METHOD FOR MANUFACTURING SEMICONDUCTOR DEVICE

This nonprovisional application is based on Japanese Patent Application No. 2015-165697 filed on Aug. 25, 2015 with the Japan Patent Office, the entire contents of which are hereby incorporated by reference.

BACKGROUND OF THE INVENTION

Field of the Invention

The present invention relates to a method for manufacturing a semiconductor device.

Description of the Background Art

A semiconductor device including plural types of circuit patterns such as memory cells, for example, has been known. In such a semiconductor device, a plurality of level difference portions (such as various electrodes) provided to project with respect to a main surface of a semiconductor substrate are formed. Arrangement of the level difference portions in a semiconductor device is different for each circuit pattern. Generally, a semiconductor device includes a region in which the level difference portions are formed relatively densely (hereinafter referred to as a first region), and a region in which the level difference portions are formed relatively sparsely or a region in which no level difference portion is formed (hereinafter referred to as a second region). A method for manufacturing such a semiconductor device includes the step of forming various films on and between the level difference portions formed on a semiconductor substrate, and the step of processing the films (such as a photolithography step or an etch-back treatment step).

The photolithography step is disclosed, for example, in Japanese Patent Laying-Open No. 2010-245160 (Patent Document 1), and US Patent Application Publication No. 2004/0065917 (Patent Document 2). Patent Document 1 discloses a method for manufacturing a semiconductor device for solving a problem caused when an anti-reflection film applied in a region having a high level difference flows to a region having a low level difference and disappears. Specifically, in Patent Document 1, a dummy electrode and a polysilicon film serving as level difference portions are formed with a gap groove being sandwiched therebetween. Thus, when an anti-reflection film having a high flowability is applied on a polysilicon film formed to cover these components, disappearance of the anti-reflection film in the region having a high level difference is suppressed.

US Patent Application Publication No. 2004/0065917 discloses a memory cell having a transistor structure different from that of Patent Document 1, and a method for manufacturing the same. Also in the method for manufacturing the memory cell described in Patent Document 2, the first region and the second region described above are formed.

SUMMARY OF THE INVENTION

However, when an applied film having flowability is formed on a main surface of a semiconductor substrate in order to bury projections and recesses formed due to the level difference portions in the methods for manufacturing the semiconductor device described above, a material having a high flowability tends to flow from the first region into the second region. Therefore, an upper surface of the applied film formed on a peripheral region of the first region located close to the second region has a lower height with respect to the main surface, as compared to an upper surface of the applied film formed in a region which is more distant from the second region than the peripheral region. That is, in the first region, the upper surface of the applied film includes a surface inclined with respect to the main surface, and is not fully flattened. Accordingly, with a conventional method for manufacturing a semiconductor device in which processing such as etch-back treatment is performed on a film to be treated on the first region using such an applied film, it has been difficult to obtain a semiconductor device including a film to be treated having a uniform height.

Other problems and new features will become apparent from the description of the present specification and the accompanying drawings.

In a method for manufacturing a semiconductor device in accordance with one embodiment, a semiconductor substrate including a first region and a second region on a main surface is prepared, the first region being a region in which a plurality of first level difference portions are formed, the second region being a region in which a plurality of second level difference portions arranged more sparsely than the plurality of first level difference portions are formed, or a region in which no level difference portion is formed. A photosensitive film is formed at least on a portion of the second region to surround a periphery of the first region as seen in plan view. An applied film having flowability is formed to cover the first region and the photosensitive film. According to the one embodiment, a semiconductor device including a film to be treated having a uniform height can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
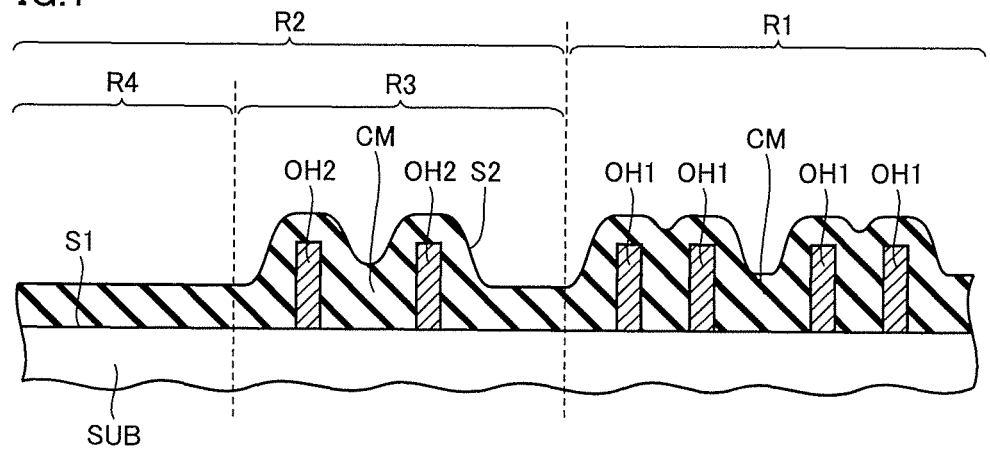
FIG. 1 is a cross sectional view showing a first step of a method for manufacturing a semiconductor device in accordance with a first embodiment.

Hereinafter, embodiments will be described with reference to the drawings. It should be noted that identical or corresponding parts in the drawings will be designated by the same reference numerals, and the description thereof will not be repeated.

First Embodiment

A method for manufacturing a semiconductor device in accordance with a first embodiment will be described with reference to FIGS. 1 to 5. First, as shown in FIG. 1, a semiconductor substrate SUB having a main surface S1 and including a first region R1 and a second region R2 on main surface S1 is prepared. In first region R1, a plurality of first level difference portions OH1 are formed. Second region R2 has a third region R3 in which a plurality of second level difference portions OH2 arranged more sparsely than the plurality of first level difference portions OH1 are formed, and a fourth region R4 in which no level difference portion is formed. First region R1 and second region R2 are adjacent to each other. Second region R2 is formed, for example, to surround the periphery of first region R1 as seen in plan view (see FIG. 2B). Here, plan view means viewing main surface S1 from above in a direction perpendicular to main surface S1. In second region R2, each of third region R3 and fourth region R4 can be formed at any position. For example, as shown in FIG. 1, third region R3 is adjacent to first region R1, and fourth region R4 is formed at a position which is more distant from first region R1 than third region R3. Each of outer peripheral end portions of first region R1 and second region R2 is located at a portion on main surface S1 in which first level difference portion OH1 and second level difference portion OH2 are not formed, and which is flatter than a portion in which a surface S2 of a coating film CM described later is formed on first level difference portions OH1 and second level difference portions OH2.

It should be noted that second region R2 only has to include at least one of third region R3 and fourth region R4. Second region R2 may include fourth region R4 only and may have no level difference portion formed therein (the details will be described later).

The plurality of first level difference portions OH1 and the plurality of second level difference portions OH2 are portions formed to project with respect to main surface S1, and the both have the same structure, for example. It should be noted that the plurality of first level difference portions OH1 and the plurality of second level difference portions OH2 may have structures different from each other.

The shortest interval between adjacent first level difference portions OH1 is shorter than the shortest interval between adjacent second level difference portions OH2. Further, the interval between first level difference portion OH1 and second level difference portion OH2 which are adjacent to each other with a boundary between first region R1 and second region R2 being sandwiched therebetween is longer than the interval between adjacent first level difference portions OH1 in first region R1.

As shown in FIG. 1, coating film CM is formed on main surface S1 of semiconductor substrate SUB. Coating film CM is formed to cover first level difference portions OH1 and second level difference portions OH2. Projections and recesses corresponding to first level difference portions OH1 are formed in coating film CM formed in first region R1. Projections and recesses corresponding to second level difference portions OH2 are formed in coating film CM formed in third region R3 of second region R2. Coating film CM can be formed by any method, and is formed, for example, by a chemical vapor deposition (CVD) method.

Figure 2A:
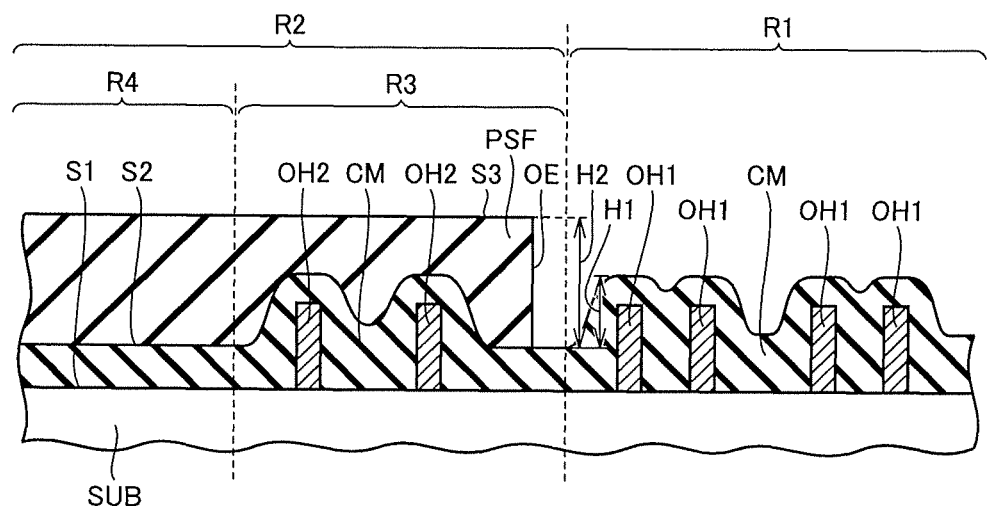
FIG. 2A is a cross sectional view showing a second step of the method for manufacturing the semiconductor device in accordance with the first embodiment.
Figure 2B:
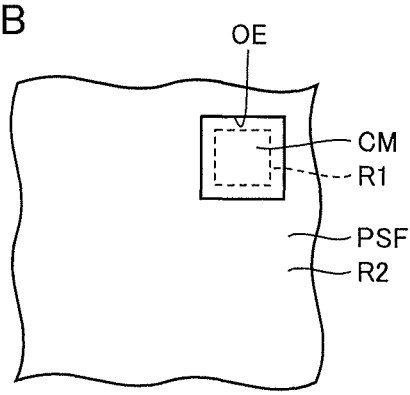
FIG. 2B is a plan view showing the second step of the method for manufacturing the semiconductor device in accordance with the first embodiment.

Next, as shown in FIGS. 2A and 2B, a photosensitive film PSF is formed on coating film CM to surround the periphery of first region R1 as seen in plan view. It should be noted that FIG. 2B is a plan view for illustrating a region in which photosensitive film PSF is formed in semiconductor substrate SUB shown in FIG. 2A. Photosensitive film PSF is formed on second region R2 to continuously surround the entire periphery of first region R1 as seen in plan view. In other words, photosensitive film PSF is formed to have an opening in a region which overlaps first region R1 as seen in plan view. As shown in FIG. 2A, an opening end portion OE of photosensitive film PSF is formed to pass through between first level difference portion OH1 which is closest to the boundary between first region R1 and second region R2 in first region R1 and second level difference portion OH2 which is closest to the boundary in second region R2. The material for photosensitive film PSF is a material having photosensitivity. Photosensitive film PSF is formed by being applied on main surface S1 of semiconductor substrate SUB with a spinner, for example, and being subjected to exposure to light and development.

An upper surface S3 of photosensitive film PSF is higher than surface S2 of coating film CM formed within first region R1. In other words, a film thickness H2 of photosensitive film PSF is thicker than a maximum level difference H1 of coating film CM. The film thickness of photosensitive film PSF is more than or equal to 1 time and less than or equal to 2 times a film thickness of an applied film LQF described later. Preferably, the film thickness of photosensitive film PSF is more than or equal to 1 time and less than or equal to 1.5 times the film thickness of applied film LQF described later. Here, film thickness H2 of photosensitive film PSF refers to a distance between upper surface S3 of photosensitive film PSF formed on coating film CM having flat surface S2 and surface S2, in a direction vertical to main surface S1. Maximum level difference H1 of coating film CM refers to a distance between the flatter portion described above and a portion located on first level difference portions OH1, in surface S2 of coating film CM, in the vertical direction described above.

It should be noted that photosensitive film PSF only has to be formed at least on a portion of second region R2 (the details will be described later). Further, photosensitive film PSF may be formed to intermittently surround the periphery of first region R1 as seen in plan view (the details will be described later). Further, photosensitive film PSF may be formed in third region R4 to surround the plurality of level difference portions OH1 and OH2 formed in first region R1 and second region R2 (the details will be described later).

Figure 3:
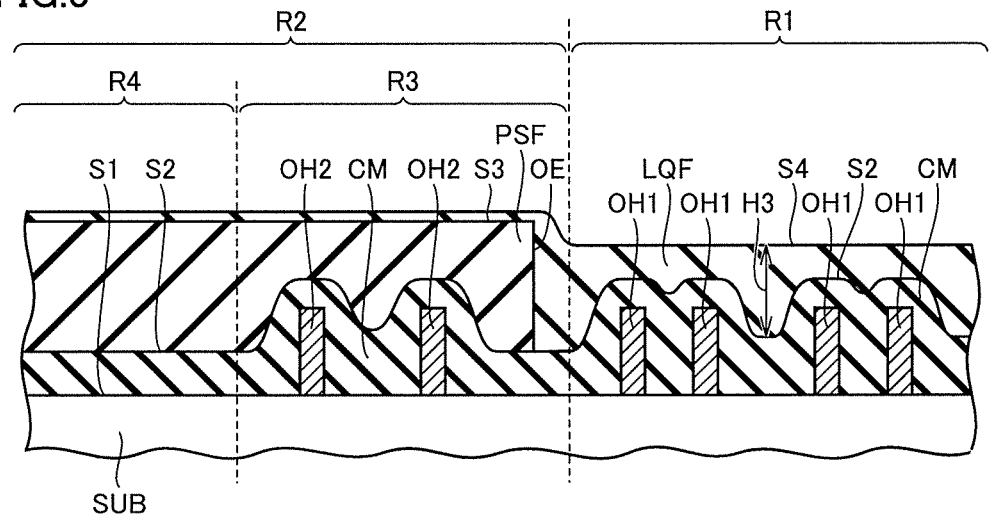
FIG. 3 is a cross sectional view showing a third step of the method for manufacturing the semiconductor device in accordance with the first embodiment.

Next, as shown in FIG. 3, applied film LQF is formed on main surface S1 of semiconductor substrate SUB. Applied film LQF is formed to cover coating film CM in first region R1, and is formed to cover photosensitive film PSF in second region R2.

Applied film LQF is made of a material having flowability enough to be able to bury projections and recesses formed in coating film CM in first region R1 and form a flat upper surface S4. Further, applied film LQF is made of a material which can be etched at an etching rate equal to the etching rate of coating film CM in etch-back treatment described later. Applied film LQF has a viscosity of less than or equal to 100 cP, and preferably less than or equal to 10 cP. Applied film LQF may be made of a material used for another use in another step of the method for manufacturing the semiconductor device. Applied film LQF may include a polyimide resin composition mainly composed of polyimide, for example (for example, a composition used as a polyimide film). Applied film LQF may include a resin composition including polyvinyl carbazole, a fluorene phenol novolac resin, a fluorene naphthol novolac resin, or the like, for example (for example, a composition used as an anti-reflection film (a Bottom Anti-Reflective Coating, BARC)). Applied film LQF may include a photosensitive resin composition including a novolac resin, a naphthoquinone diazide compound, or the like, for example (for example, a composition used as a photoresist film). Applied film LQF may include a composition including an acrylic polymer, a methacrylic polymer, or the like, for example (for example, a composition used as a gap filler). The material for applied film LQF only has to include at least one selected from the group consisting of the compositions described above. For example, applied film LQF may be made of only the anti-reflection film described above, or may be made as a stacked film including the anti-reflection film and the photoresist film described above. Applied film LQF is applied on main surface S1 of semiconductor substrate SUB with a spinner, for example. Thus, as shown in FIG. 3, upper surface S4 of applied film LQF is flatly formed in first region R1.

A film thickness H3 of applied film LQF is more than or equal to a film thickness required to allow upper surface S4 of applied film LQF to be flatly formed in first region R1, and is thinner than film thickness H2 of photosensitive film PSF (see FIG. 2) as described above. Here, film thickness H3 of applied film LQF refers to a distance between upper surface S4 of applied film LQF formed on a portion in which surface S2 of coating film CM is flat and surface S2, in first region R1, in the vertical direction described above. For example, film thickness H3 of applied film LQF is less than or equal to 3 μm when applied film LQF has a viscosity of less than or equal to 100 cP, and is less than or equal to 0.3 μm when applied film LQF has a viscosity of less than or equal to 10 cP. Upper surface S4 of applied film LQF in first region R1 has a lower height with respect to main surface S1, as compared to upper surface S4 of applied film LQF in second region R2.

It should be noted that applied film LQF and photosensitive film PSF may be made of the same material (the details will be described later).

Figure 4:
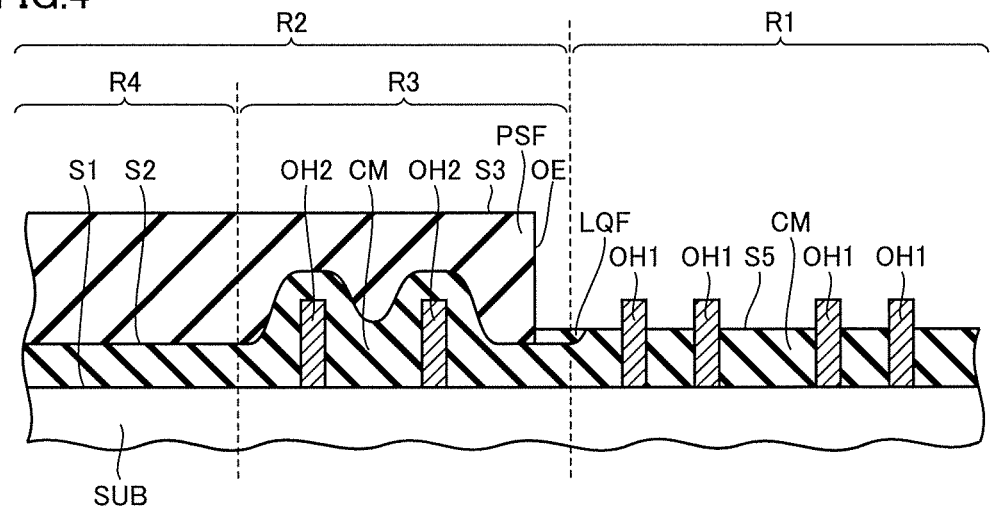
FIG. 4 is a cross sectional view showing a fourth step of the method for manufacturing the semiconductor device in accordance with the first embodiment.

Next, as shown in FIG. 4, at least portions of coating film CM and applied film LQF are removed. For example, plasma etching (etch-back treatment) is performed on main surface S1 of semiconductor substrate SUB. The plasma etching is performed under the conditions that the etching rate of coating film CM is equal to the etching rate of applied film LQF, and the etching rate of photosensitive film PSF is lower than the etching rate of applied film LQF and coating film CM. The plasma etching is performed until portions of first level difference portions OH1 are exposed above coating film CM. A surface S5 of coating film CM formed as described above has a shape corresponding to the shape of upper surface S4 of applied film LQF shown in FIG. 3. Coating film CM is processed in first region R1 into a film which covers main surface S1 of semiconductor substrate SUB and portions of first level difference portions OH1, and which has a uniform height (which is flat).

Figure 5:
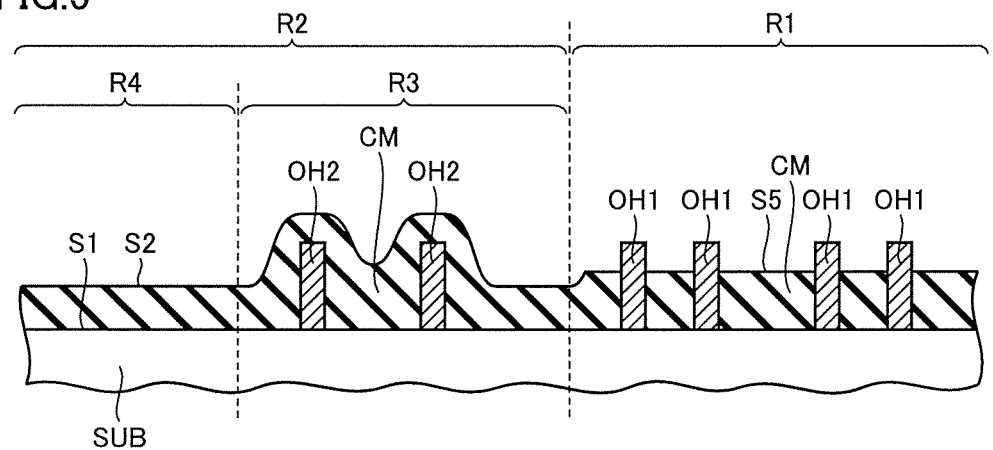
FIG. 5 is a cross sectional view showing a fifth step of the method for manufacturing the semiconductor device in accordance with the first embodiment.

Next, as is shown in FIG. 5, photosensitive film PSF and applied film LQF remaining on main surface S1 after the etch-back treatment described above are removed. Thereby, the semiconductor device including first level difference portions OH1 and flat coating film CM covering main surface S1 of semiconductor substrate SUB and portions of first level difference portions OH1 can be obtained.

Next, the function and effect of the method for manufacturing the semiconductor device in accordance with the first embodiment will be described. The method for manufacturing the semiconductor device in accordance with the first embodiment is intended to obtain a semiconductor device including (flattened) coating film CM having a uniform height on first region R1. In the first embodiment, photosensitive film PSF is formed to surround the periphery of first region R1 in which the level difference portions are densely arranged as seen in plan view. Thereafter, applied film LQF having flowability is formed to cover first region R1 and photosensitive film PSF.

With such a configuration, since photosensitive film PSF is formed to surround the periphery of first region R1, applied film LQF having flowability is less likely to flow from first region R1 into second region R2. Therefore, upper surface S4 of applied film LQF is flatly formed on first region R1. As a result, by performing the etch-back treatment on applied film LQF and coating film CM, coating film CM (film to be treated) can have a uniform height in first region R1.

Further, photosensitive film PSF can be easily removed from above semiconductor substrate SUB after the etch-back treatment. Therefore, as compared to a case where a structural object for suppressing outflow of applied film LQF from first region R1 to second region R2 is formed to remain on a semiconductor device eventually obtained, the method for manufacturing the semiconductor device in accordance with the first embodiment can eliminate a region for forming such a structural object, and can downsize the semiconductor device. Further, since photosensitive film PSF can be easily removed in the method for manufacturing the semiconductor device in accordance with the first embodiment, a region for forming photosensitive film PSF is not particularly limited. Therefore, the method for manufacturing the semiconductor device in accordance with the first embodiment can be applied regardless of the arrangement pattern of first region R1 and second region R2 on main surface S1 or the like. For example, the method for manufacturing the semiconductor device in accordance with the first embodiment can be easily applied to any method for manufacturing an existing semiconductor device, without changing the design of the existing semiconductor device or taking other measures.

Further, it is possible to improve the flatness of applied film LQF within one first region R1 by making the film thickness of applied film LQF to be fully thicker than maximum level difference H1 of coating film CM, without suppressing the outflow of applied film LQF as described above In this case, however, it takes a longer time to etch applied film LQF, which leads to a problem that the manufacturing cost of the semiconductor device is increased. In addition, the film thickness of applied film LQF varies widely among a plurality of first regions R1, which leads to a problem that coating film CM subjected to the etch-back treatment using applied film LQF has wide variations in film thickness among the plurality of first regions R1. In contrast, in the method for manufacturing the semiconductor device in accordance with the first embodiment, the outflow of applied film LQF can be suppressed by photosensitive film PSF, and thus the flatness of applied film LQF can be improved without making the film thickness of applied film LQF to be fully thicker than maximum level difference H1 of coating film CM. Therefore, according to the method for manufacturing the semiconductor device in accordance with the first embodiment, a semiconductor device including coating film CM having a high flatness can be obtained without increasing manufacturing cost. Further, according to the method for manufacturing the semiconductor device in accordance with the first embodiment, variations in the film thickness of coating film CM among a plurality of semiconductor devices (among the plurality of first regions R1) formed on one semiconductor substrate SUB can be suppressed.

In the method for manufacturing the semiconductor device described above, the film thickness of photosensitive film PSF is more than or equal to 1 time and less than or equal to 2 times the film thickness of applied film LQF.

When the film thickness of photosensitive film PSF is more than or equal to 1 time the film thickness of applied film LQF, photosensitive film PSF can suppress the outflow of applied film LQF from first region R1 to second region R2. Therefore, thinning of applied film LQF is suppressed in a region of first region R1 at a position relatively close to second region R2 (an outer peripheral region of first region R1). As a result, applied film LQF can be fully flattened with the film thickness described above in first region R1. On the other hand, when the film thickness of photosensitive film PSF is more than 2 times the film thickness of applied film LQF, it is difficult to apply and spread applied film LQF on photosensitive film PSF. Therefore, there occurs a problem that an abnormality occurs, such as an uneven film thickness of applied film LQF within first region R1 or cissing within second region R2. When the film thickness of photosensitive film PSF is less than or equal to 2 times the film thickness of applied film LQF, occurrence of the abnormality described above can be effectively suppressed, as compared to the case where the film thickness of photosensitive film PSF is more than 2 times the film thickness of applied film LQF.

Preferably, the film thickness of photosensitive film PSF is more than or equal to 1 time and less than or equal to 1.5 times the film thickness of applied film LQF. With such a configuration, applied film LQF can be fully flattened also in a region of first region R1 at a position relatively close to photosensitive film PSF, as compared to the case where the film thickness of photosensitive film PSF is more than 1.5 times the film thickness of applied film LQF.

In the step of forming photosensitive film PSF, photosensitive film PSF is formed to surround the entire periphery of first region R1. With such a configuration, photosensitive film PSF can further limit the outflow of applied film LQF from first region R1 to second region R2. In this case, it is preferable that photosensitive film PSF and applied film LQF are provided to have a small difference in film thickness therebetween. Preferably, the film thickness of photosensitive film PSF is more than or equal to 1 time and less than or equal to 1.3 times the film thickness of applied film LQF, for example. With such a configuration, an abnormality (such as an uneven film thickness or cissing) of applied film LQF in a region at a position relatively close to the opening in photosensitive film PSF can be suppressed, as compared to a case where there is a large difference in film thickness (for example, in a case where the film thickness of photosensitive film PSF is about 2 times the film thickness of applied film LQF).

Applied film LQF has a viscosity of less than or equal to 100 cP. With such a configuration, applied film LQF can bury projections and recesses formed due to the plurality of first level difference portions OH1, and can make upper surface S4 thereof to be a flat surface. Therefore, such an applied film LQF is suitable as a mask film for the etch-back treatment. Preferably, applied film LQF has a viscosity of less than or equal to 10 cP. With such a configuration, applied film LQF can easily bury projections and recesses formed due to the plurality of first level difference portions OH1, and can make upper surface S4 thereof to be a flatter surface. Therefore, by performing the etch-back treatment on coating film CM using such an applied film LQF, coating film CM having a uniform height and a high flatness can be formed.

In the step of forming photosensitive film PSF, photosensitive film PSF is formed on second region R2. The film thickness of photosensitive film PSF is more than or equal to 1 time the film thickness of applied film LQF. The etch-back treatment is performed under the condition that the etching rate of photosensitive film PSF is equal to or lower than the etching rate of applied film LQF. Thereby, since photosensitive film PSF serves as a mask for the etch-back treatment in second region R2, coating film CM formed in second region R2 can be maintained without being etched. Alternatively, the etching amount of coating film CM formed in second region R2 can be limited to be less than the etching amount of coating film CM formed in first region R1.

Specific Example

Figure 6:
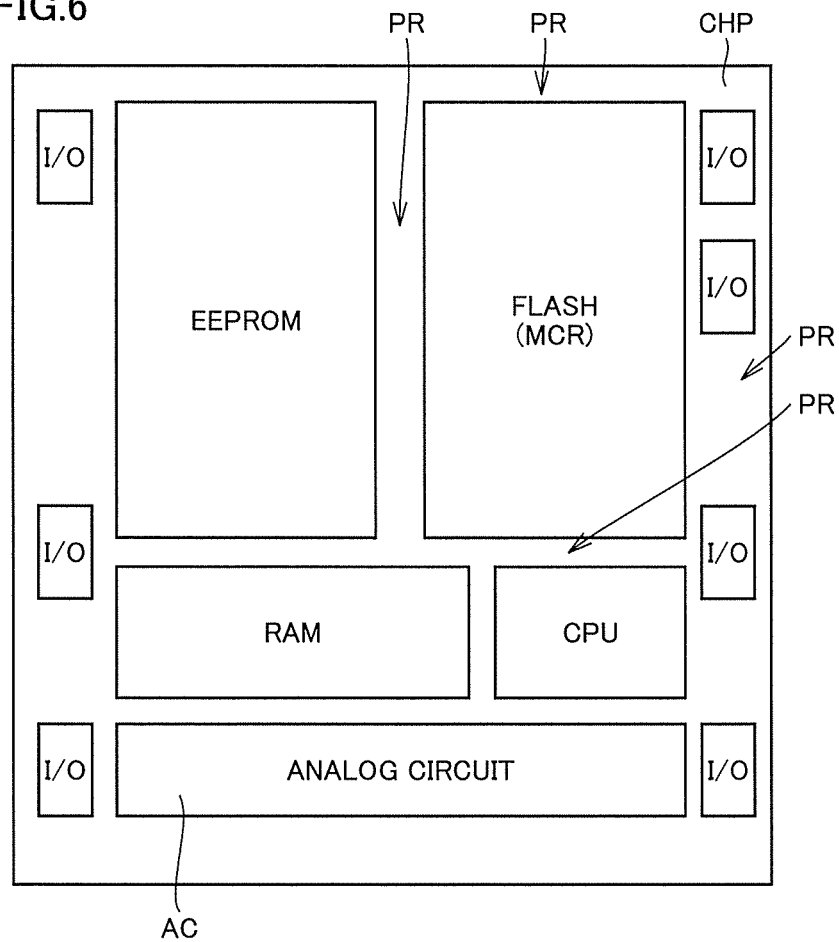
FIG. 6 is a plan view showing a layout of a semiconductor chip in accordance with a specific example.

Next, a specific example of the method for manufacturing the semiconductor device in accordance with the first embodiment will be described with reference to FIGS. 6 to 13. The specific example relates to a method for manufacturing a semiconductor device including a flash memory. FIG. 6 is a plan view showing a layout configuration of a semiconductor chip CHP in the specific example. FIGS. 7 to 9A and 10 to 13 are cross sectional views showing a method for manufacturing a semiconductor device in the specific example. FIG. 9B is a top view of semiconductor substrate SUB shown in FIG. 9A.

As shown in FIG. 6, semiconductor chip CHP has a central processing unit (CPU), a random access memory (RAM), an analog circuit AC, an electrically erasable programmable read only memory (EEPROM), a flash memory FLASH, and input/output (I/O) circuits. A plurality of semiconductor chips CHP are formed on semiconductor substrate SUB by the method for manufacturing the semiconductor device shown in FIGS. 7 to 13. Hereinafter, a region in which flash memory FLASH is eventually formed on semiconductor substrate SUB will be referred to as a memory cell formation region MCR, and a region which is other than memory cell formation region MCR and in which, for example, a transistor is formed will be referred to as a peripheral region PR.

Figure 7:
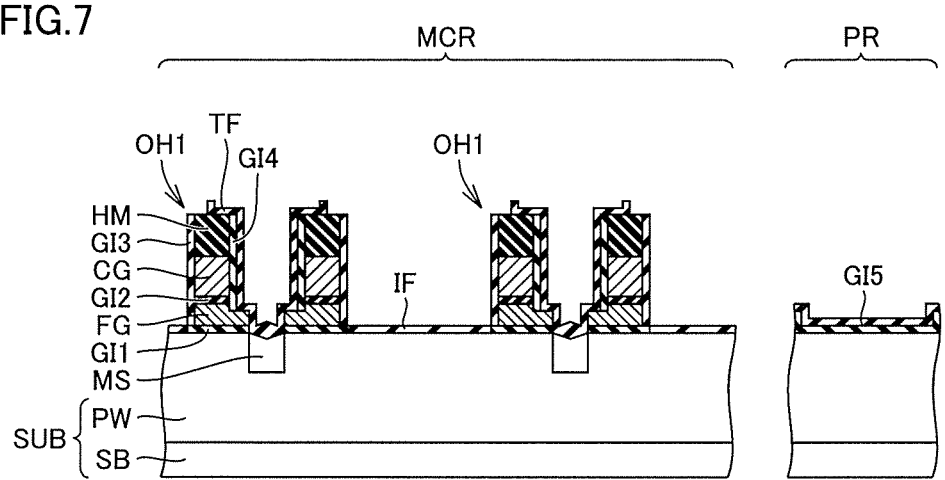
FIG. 7 is a cross sectional view showing a first step of a method for manufacturing a semiconductor device in accordance with the specific example.

First, as shown in FIG. 7, semiconductor substrate SUB having a plurality of memory cells formed in memory cell formation region MCR serving as first region R1 (see FIGS. 1 to 5) is prepared. One memory cell has one pair of gate electrode structural bodies as first level difference portion OH1. A plurality of pairs of gate electrode structural bodies are formed in semiconductor substrate SUB.

Semiconductor substrate SUB includes a substrate SB made of a single crystal of silicon (S1), for example, and a p-type well PW formed from main surface S1 to a predetermined depth by implanting a p-type impurity into substrate SB. In main surface S1 of semiconductor substrate SUB, one memory source region MS is formed for each memory cell. The gate electrode structural body has a first gate insulating film GI1, a floating gate electrode FG, a second gate insulating film GI2, a control gate electrode CG, a hard mask layer HM, sidewall gate insulating films GI3 and GI4, and a tunnel insulating film TF. One pair of gate electrode structural bodies includes two gate electrode structural bodies described above arranged on main surface S1 with memory source region MS being sandwiched therebetween.

Specifically, in memory cell formation region MCR, a plurality of floating gate electrodes FG are formed on main surface S1 with first gate insulating films GI1 being interposed therebetween. Floating gate electrodes FG are arranged such that two floating gate electrodes FG sandwich one memory source region MS therebetween. First gate insulating film GI1 is made of, for example, a single substance such as a silicon oxide film ($SiO_2$) or a silicon nitride film ($Si_3N_4$), or any combination thereof. Floating gate electrode FG is made of a conductive material. Floating gate electrode FG is made of for example, polycrystalline silicon doped with an impurity (hereinafter referred to as doped polysilicon).

On a portion of each floating gate electrode FG, control gate electrode CG is formed with second gate insulating film GI2 being interposed therebetween. Second gate insulating film GI2 is made of, for example, a single substance such as a silicon oxide film or a silicon nitride film, or any combination thereof. Control gate electrode CG is made of a conductive material. Control gate electrode CG is made of doped polysilicon, for example.

On each control gate electrode CG, hard mask layer HM is formed. Hard mask layer HM is made of a silicon nitride film, for example.

Sidewall gate insulating films GI3 and GI4 are formed to cover sidewalls of floating gate electrode FG and control gate electrode CG. Sidewall gate insulating films GI3 and GI4 are each made of; for example, a single substance such as a silicon oxide film or a silicon nitride film, or any combination thereof.

On memory source region MS and one pair of floating gate electrodes FG, control gate electrodes CG, hard mask layers HM, and sidewall gate insulating films GI4 formed to sandwich memory source region MS therebetween, tunnel insulating film TF is formed. Tunnel insulating film TF is made of, for example, a single substance such as a silicon oxide film or a silicon nitride film, or any combination thereof.

Further, between pairs of gate electrode structural bodies (first level difference portions OH1), an insulating film IF is formed to cover main surface S1. Insulating film IF is made of, for example, a single substance such as a silicon oxide film or a silicon nitride film, or any combination thereof.

In peripheral region PR of semiconductor substrate SUB, a high level difference like the gate electrode structural bodies (first level difference portion OH1) described above is not formed. Peripheral region PR is constituted as third region R3 (see FIGS. 1 to 5) of second region R2 (see FIGS. 1 to 5). In peripheral region PR, a third gate insulating film GI5 is formed. It should be noted that, in peripheral region PR, second level difference portion OH2 (see FIGS. 1 to 5) may be formed, or a level difference lower than the gate electrode structural body may be formed.

Figure 8:
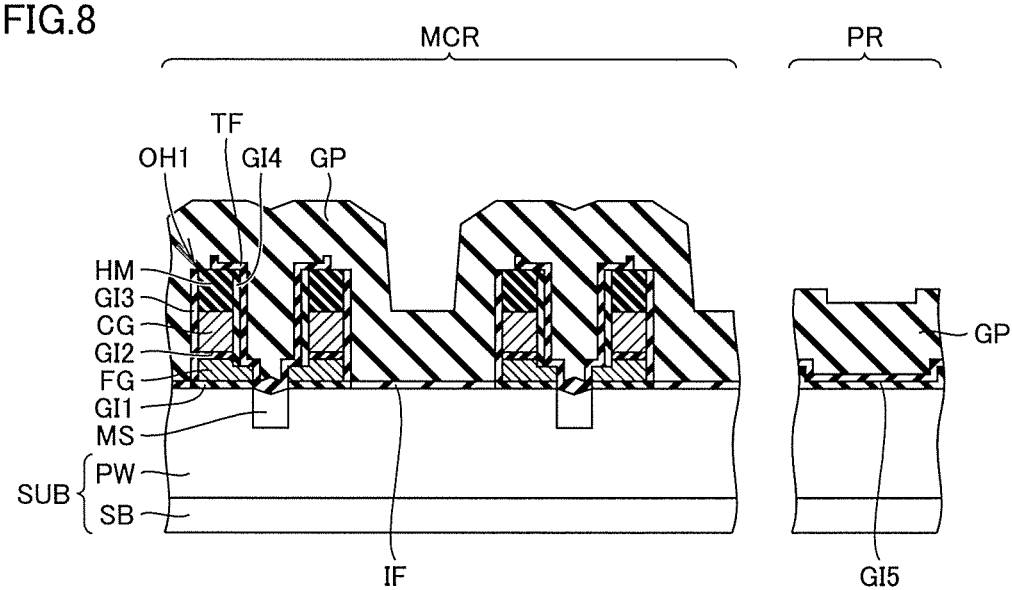
FIG. 8 is a cross sectional view showing the first step of the method for manufacturing the semiconductor device in accordance with the specific example.

Next, as shown in FIG. 8, a polysilicon film GP is formed over the entire surface of semiconductor substrate SUB. In memory cell formation region MCR, polysilicon film GP is formed to cover the gate electrode structural bodies (first level difference portions OH1). Polysilicon film GP is formed for example by the CVD method or the like, and is formed on first level difference portions OH1 with good adhesion. Polysilicon film GP has a relatively large uneven shape corresponding to first level difference portions OH1 in memory cell formation region MCR. On the other hand, polysilicon film GP has a relatively small uneven shape corresponding to third gate insulating film GI5 in peripheral region PR.

Figure 9A:
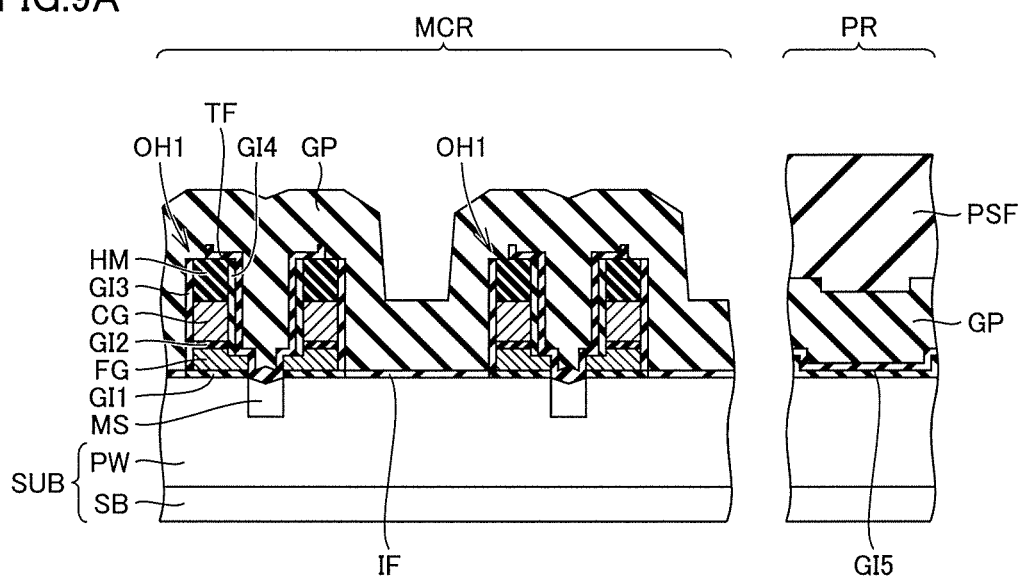
FIG. 9A is a cross sectional view showing a second step of the method for manufacturing the semiconductor device in accordance with the specific example.
Figure 9B:
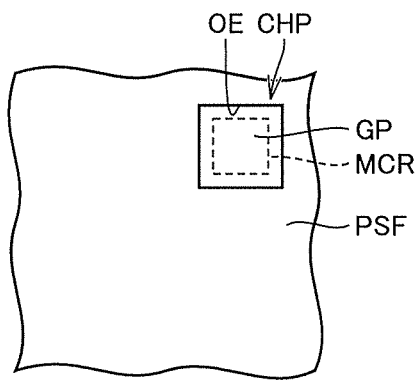
FIG. 9B is a top view showing the second step of the method for manufacturing the semiconductor device in accordance with the specific example.

Next, as shown in FIGS. 9A and 9B, photosensitive film PSF is formed around the periphery of memory cell formation region MCR. Photosensitive film PSF is, for example, a photoresist film which is a photosensitive resin composition including a novolac resin, a naphthoquinone diazide compound, or the like, or a photosensitive polyimide film which is a polyimide resin composition and includes a photosensitizing agent. First, photosensitive film PSF is applied on main surface S1 of semiconductor substrate SUB with a spinner or the like. Applied photosensitive film PSF is formed to have an opening in a region which overlaps memory cell formation region MCR, by photolithography. Opening end portion OE of photosensitive film PSF is formed to follow the periphery of memory cell formation region MCR. Photosensitive film PSF covers polysilicon film GP in most of peripheral region PR. The film thickness of photosensitive film PSF is more than or equal to 1 time and less than or equal to 2 times the film thickness of applied film LQF, and is preferably more than or equal to 1 time and less than or equal to 1.5 times the film thickness of applied film LQF.

Preferably, photosensitive film PSF is further subjected to heat treatment or ultraviolet curing treatment (UV cure). Photosensitive film PSF is cured by being subjected to heat treatment or ultraviolet curing treatment (UV cure). Furthermore, photosensitive film PSF is deformed by being subjected to heat treatment or ultraviolet curing treatment (UV cure), such that opening end portion OE is formed in a tapered shape and a corner portion which connects opening end portion OE and upper surface S3 is rounded. Thereby, when applied film LQF is applied in a subsequent step, applied film LQF is easily applied also on upper surface S3 of photosensitive film PSF. As a result, occurrence of uneven application of applied film LQF or the like can be suppressed in memory cell formation region MCR.

Figure 10:
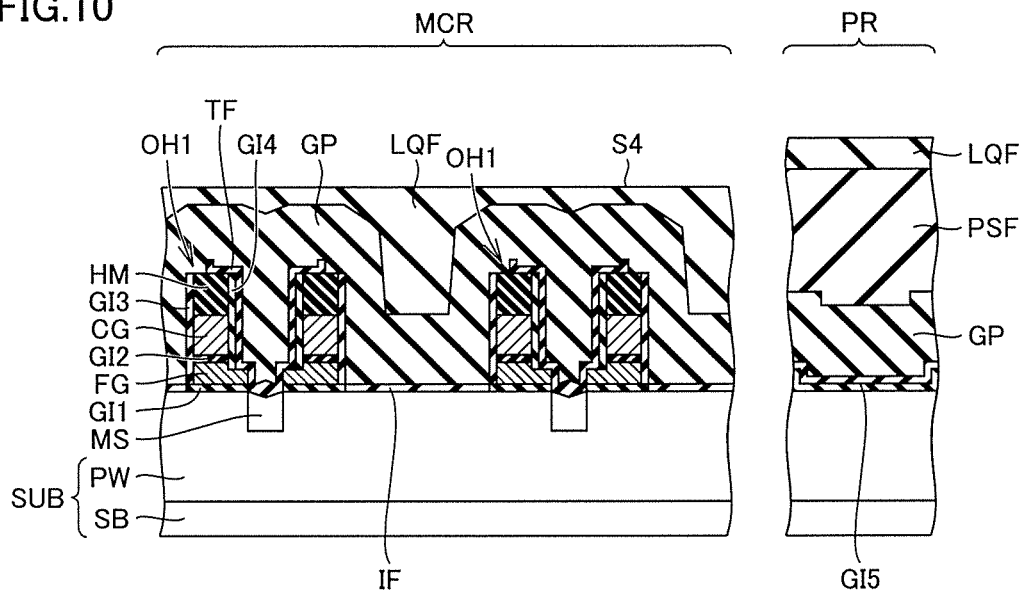
FIG. 10 is a cross sectional view showing a third step of the method for manufacturing the semiconductor device in accordance with the specific example.

Next, as shown in FIG. 10, applied film LQF made of a material having flowability is formed on main surface S1 of semiconductor substrate SUB. The material for applied film LQF is the same as the material for photosensitive film PSF, for example. Applied film LQF is applied on main surface S1 of semiconductor substrate SUB with a spinner or the like. On this occasion, since the periphery of memory cell formation region MCR is surrounded by photosensitive film PSF, outflow of applied film LQF from memory cell formation region MCR to peripheral region PR is suppressed. Further, since applied film LQF is applied on photosensitive film PSF having a film thickness which is more than or equal to 1 time and less than or equal to 2 times the film thickness of applied film LQF, occurrence of an abnormality such as an uneven film thickness and cissing of applied film LQF is suppressed. As a result, upper surface S4 of applied film LQF has a high flatness at least in memory cell formation region MCR.

Figure 11:
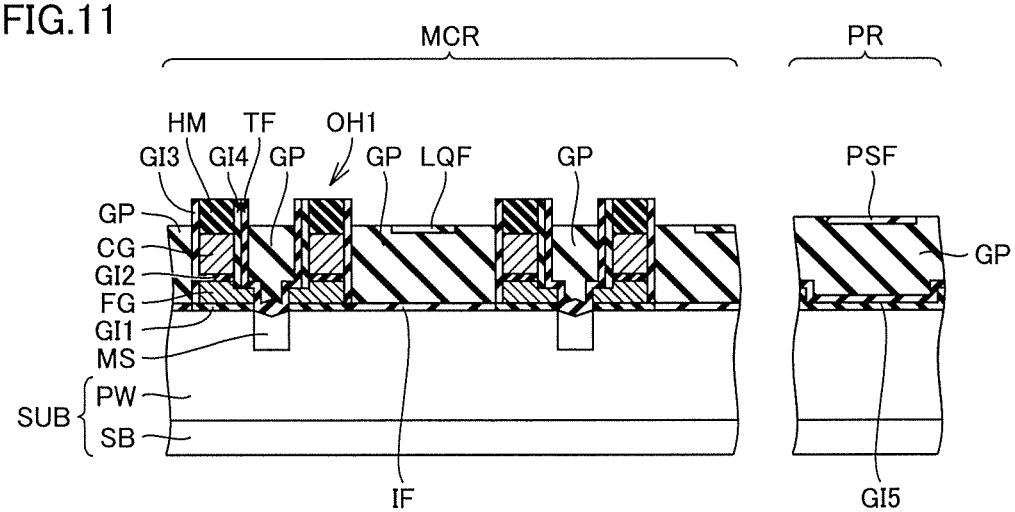
FIG. 11 is a cross sectional view showing a fourth step of the method for manufacturing the semiconductor device in accordance with the specific example.

Next, as shown in FIG. 11, plasma etching treatment is performed on entire main surface S1 of semiconductor substrate SUB. The plasma etching treatment is performed under the conditions that applied film LQF and polysilicon film GP can be etched at an equal etching rate, and the etching rate of applied film LQF and polysilicon film GP is faster than the etching rate of each material constituting the gate electrode structural bodies (first level difference portion OH1). Thereby, in memory cell formation region MCR, polysilicon film GP is subjected to etch-back treatment. On this occasion, since upper surface S4 of applied film LQF is flatly formed, the surface of polysilicon film GP formed by the etch-back treatment has flatness equal to the shape of upper surface S4 of applied film LQF. That is, the film thickness (height with respect to main surface S1) of polysilicon film GP formed in first region R1 at a position adjacent to peripheral region PR is equal to the film thickness (height) of polysilicon film GP formed at a position which is more distant from peripheral region PR than the adjacent position. The surface of polysilicon film GP formed by the etch-back treatment is formed, for example, between two hard mask layers HM constituting one pair of first level difference portions OH1.

On this occasion, photosensitive film PSF is made of the same material as that for applied film LQF, and the total film thickness of applied film LQF and photosensitive film PSF formed in peripheral region PR is thicker than the film thickness of applied film LQF formed in memory cell formation region MCR. Therefore, when applied film LQF and polysilicon film GP are subjected to the etch-back treatment in memory cell formation region MCR as described above, applied film LQF and photosensitive film PSF are mainly etched in peripheral region PR. Thereby, as shown in FIG. 11, etching on polysilicon film GP formed in peripheral region PR can be suppressed, and for example, only a portion of polysilicon film GP can be subjected to the etch-back treatment in peripheral region PR. It should be noted that it is also possible to completely prevent polysilicon film GP formed in peripheral region PR from being subjected to the etch-back treatment, by appropriately selecting the film thickness of photosensitive film PSF, the conditions of the plasma etching treatment, and the like. It is only necessary that polysilicon film GP formed in peripheral region PR is suppressed from being etched to have a film thickness which is less than the film thickness required as a gate electrode GE (see FIG. 13) described later, for example.

Figure 12:
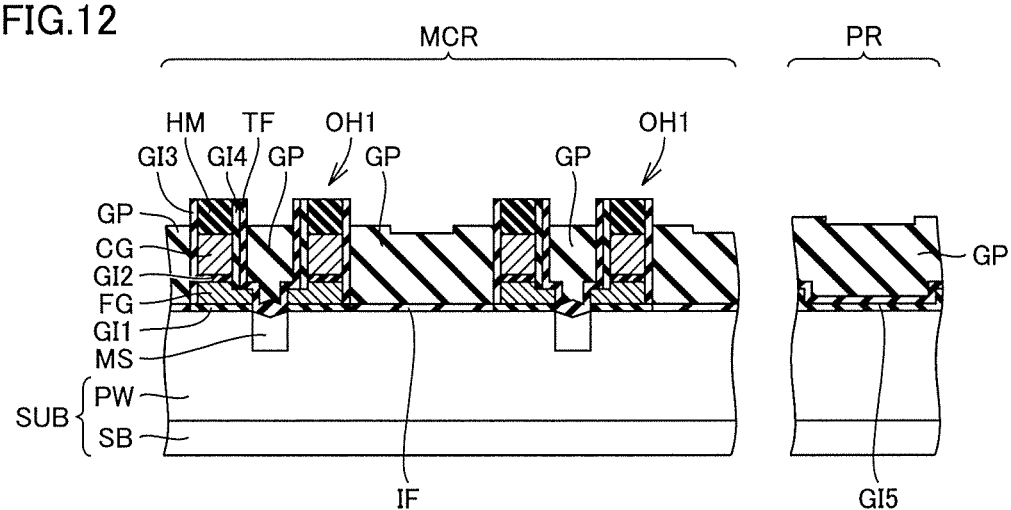
FIG. 12 is a cross sectional view showing a fifth step of the method for manufacturing the semiconductor device in accordance with the specific example.

Next, as shown in FIG. 12, applied film LQF and photosensitive film PSF remaining in memory cell region MCR and peripheral region PR are selectively removed. Applied film LQF and photosensitive film PSF are removed by wet etching treatment, for example. The wet etching treatment is performed under the condition that the etching rate of applied film LQF and photosensitive film PSF is faster than the etching rate of first level difference portions OH1 and polysilicon film GP.

Figure 13:
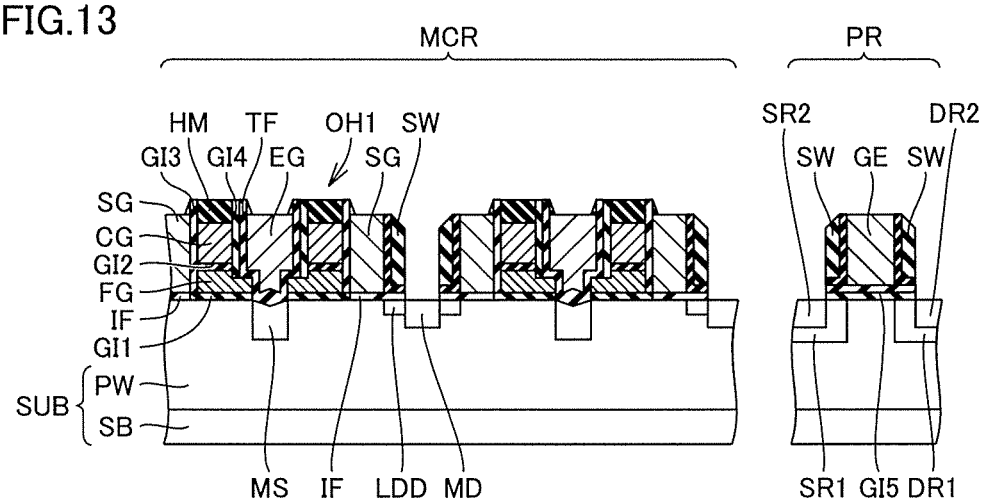
FIG. 13 is a cross sectional view showing a sixth step of the method for manufacturing the semiconductor device in accordance with the specific example.

Thereafter, polysilicon film GP flattened as described above is processed. Specifically, polysilicon film GP located on a region which will become a memory drain region MD (see FIG. 13) in memory cell formation region MCR and regions which will become a source region SR (see FIG. 13) and a drain region DR (see FIG. 13) in peripheral region PR is removed. Thereafter, ions of an impurity are implanted from the main surface S1 side of semiconductor substrate SUB, using polysilicon film GP and the like as a mask. Thereby, so-called LDD (Light Doped Drain) regions (see FIG. 13) are formed in memory cell formation region MCT. Further, a low-concentration source region SR1 and a low-concentration drain region DR1 are formed in peripheral region PR. Thereafter, a sidewall insulating film SW (see FIG. 13) is formed to cover a sidewall of a selection gate electrode SG which is opposite to a sidewall thereof facing floating gate electrode FG. Further, a sidewall insulating film SW (see FIG. 13) is formed to cover a sidewall of gate electrode GE. Sidewall insulating film SW is made of, for example, a single substance such as a silicon oxide film or a silicon nitride film, or any combination thereof. Furthermore, ions of an impurity are implanted from the main surface S1 side of semiconductor substrate SUB, using sidewall insulating films SW and the like as a mask. Thereby, memory drain region MD (see FIG. 13) having an impurity concentration higher than that of the LDD region is formed in memory cell formation region MCT. Furthermore, a high-concentration source region SR2 (see FIG. 13) having an impurity concentration higher than that of low-concentration source region SR1, and a high-concentration drain region DR2 (see FIG. 13) having an impurity concentration higher than that of low-concentration drain region DR1 are formed in peripheral region PR. Consequently, as shown in FIG. 13, the main portion of the semiconductor device is formed in memory cell formation region MCR and peripheral region PR. It should be noted that, while the method for manufacturing the semiconductor device in accordance with the first embodiment is suitable as a method for manufacturing a semiconductor device including a flash memory as described in the specific example, it is also suitable as a method for manufacturing any semiconductor device including first region R1 and second region R2.

Second Embodiment

Next, a method for manufacturing a semiconductor device in accordance with a second embodiment will be described with reference to FIGS. 14 to 18. Although the method for manufacturing the semiconductor device in accordance with the second embodiment has a configuration which is basically the same as that of the method for manufacturing the semiconductor device in accordance with the first embodiment, it is different therefrom in that the film to be treated by the etch-back treatment is not coating film CM (see FIGS. 1 to 5) but first level difference portions OH1 (and second level difference portions OH2).

Figure 14:
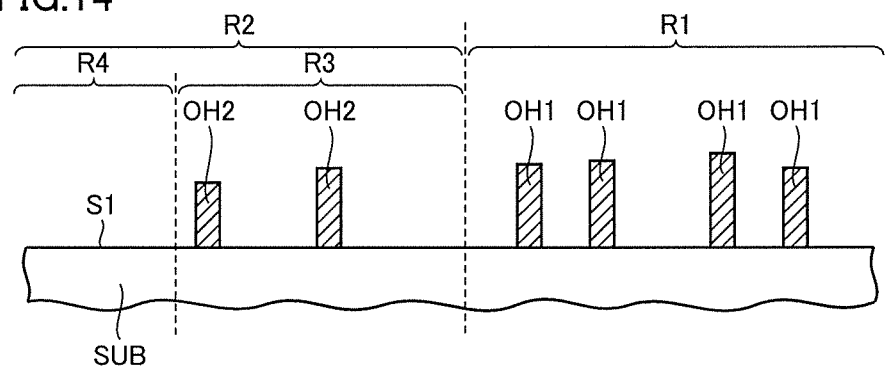
FIG. 14 is a cross sectional view showing a first step of a method for manufacturing a semiconductor device in accordance with a second embodiment.

First, as shown in FIG. 14, semiconductor substrate SUB having first level difference portions OH1 and second level difference portions OH2 is prepared. Although semiconductor substrate SUB has a configuration which is basically the same as that in the first embodiment, it is different therefrom in that the plurality of level difference portions OH1 and OH2 have various heights with respect to main surface S1, and that coating film CM is not formed.

Figure 15:
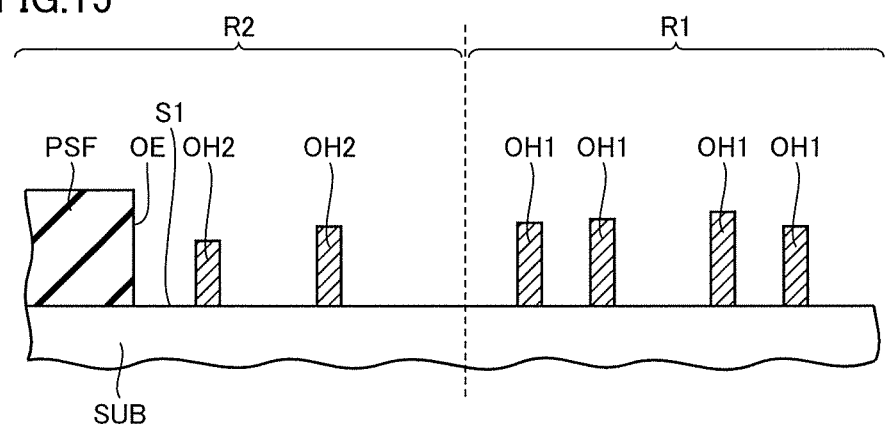
FIG. 15 is a cross sectional view showing a second step of the method for manufacturing the semiconductor device in accordance with the second embodiment.

Next, as shown in FIG. 15, photosensitive film PSF is formed to surround the periphery of first region R1. Although photosensitive film PSF has a configuration which is basically the same as that in the first embodiment, it is different therefrom in that it is formed such that the plurality of second level difference portions OH2 formed in second region R2 are exposed within an opening in photosensitive film PSF.

Figure 16:
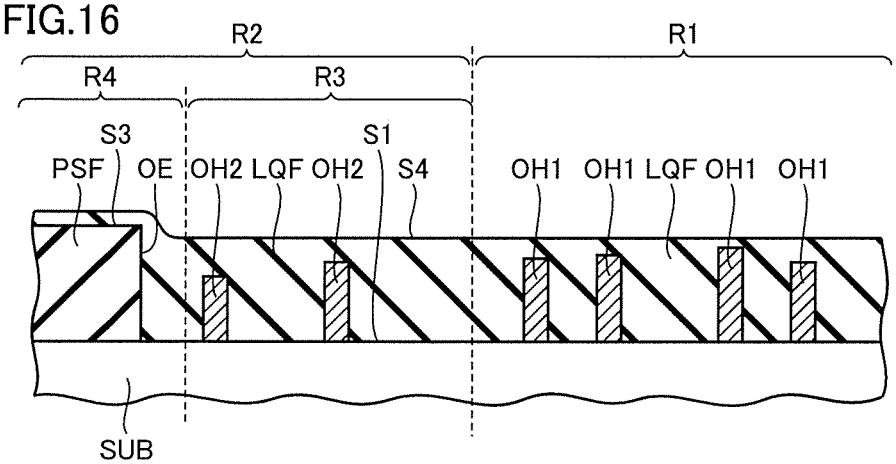
FIG. 16 is a cross sectional view showing a third step of the method for manufacturing the semiconductor device in accordance with the second embodiment.

Next, as shown in FIG. 16, applied film LQF is formed on main surface S1 of semiconductor substrate SUB. Although applied film LQF has a configuration which is basically the same as that in the first embodiment, it is different therefrom in that it is flattened on first region R1 and a portion of second region R2 exposed within the opening in photosensitive film PSF. Upper surface S4 of applied film LQF is flatly formed on level difference portions OH 2 formed in second region R2.

Figure 17:
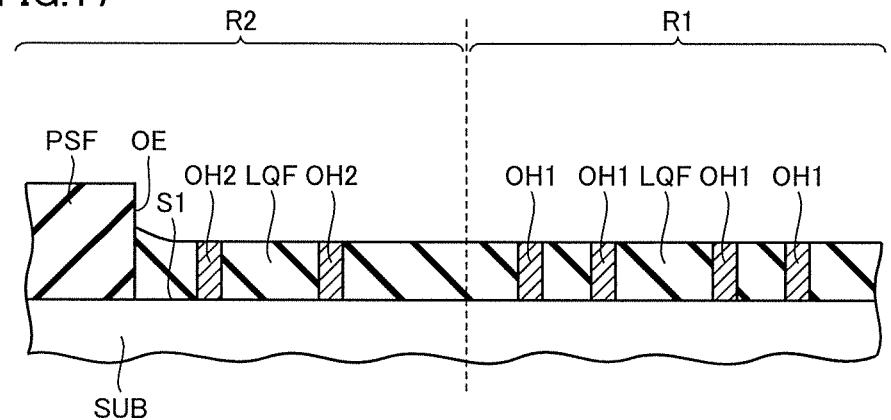
FIG. 17 is a cross sectional view showing a fourth step of the method for manufacturing the semiconductor device in accordance with the second embodiment.

Next, as shown in FIG. 17, portions of level difference portions OH1, OH2, and applied film LQF are removed. For example, plasma etching (etch-back treatment) is performed on main surface S1 of semiconductor substrate SUB. The plasma etching is performed under the condition that the etching rate of level difference portions OH1 and OH2 is equal to the etching rate of applied film LQF. The plasma etching is performed until the plurality of level difference portions OH1 and OH2 serving as the film to be treated have a predetermined height with respect to main surface S1. Upper surfaces of level difference portions OH1 and OH2 formed as described above have a shape corresponding to the shape of upper surface S4 of applied film LQF. Therefore, the plurality of level difference portions OH1 and OH2 have a uniform height with respect to main surface S1 in first region R1 and second region R2, by the etch-back treatment.

Figure 18:
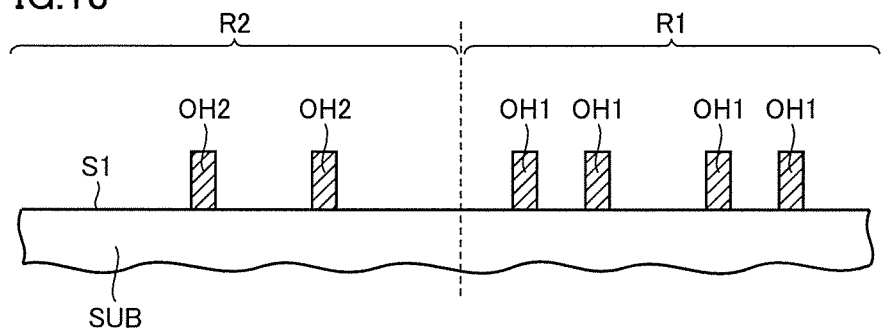
FIG. 18 is a cross sectional view showing a fifth step of the method for manufacturing the semiconductor device in accordance with the second embodiment.

Next, as shown in FIG. 18, photosensitive film PSF and applied film LQF remaining after the etch back are removed. Thereby, the semiconductor device including the plurality of level difference portions OH1 and OH2 (the film to be treated) having a uniform height can be obtained.

It should be noted that, in the second embodiment, the film to be treated by the etch-back treatment may be first level difference portions OH1 only. In this case, photosensitive film PSF is formed on main surface S1 to have an opening in a region which overlaps first region R1 as seen in plan view, as with photosensitive film PSF in the first embodiment.

<Variation>

Next, a variation of the methods for manufacturing the semiconductor device in accordance with the first embodiment and the second embodiment will be described.

Figure 19:
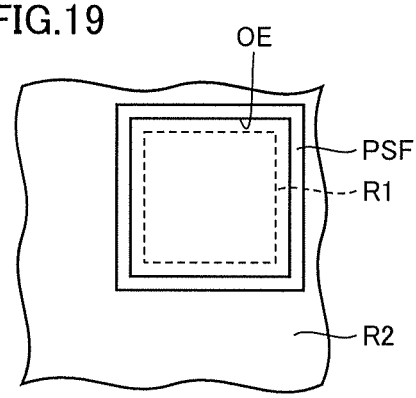
FIG. 19 is a plan view showing a variation of the methods for manufacturing the semiconductor device in accordance with the first embodiment and the second embodiment.

As shown in FIG. 19, photosensitive film PSF may be formed only in a portion of second region R2. Photosensitive film PSF may be formed only in a region located at a position relatively close to first region R1, in second region R2. Also with such a configuration, applied film LQF can be fully flattened on first region R1 exposed within the opening in photosensitive film PSF, and thus the same effect as that of the methods for manufacturing the semiconductor device in accordance with the first embodiment and the second embodiment can be achieved.

Figure 20:
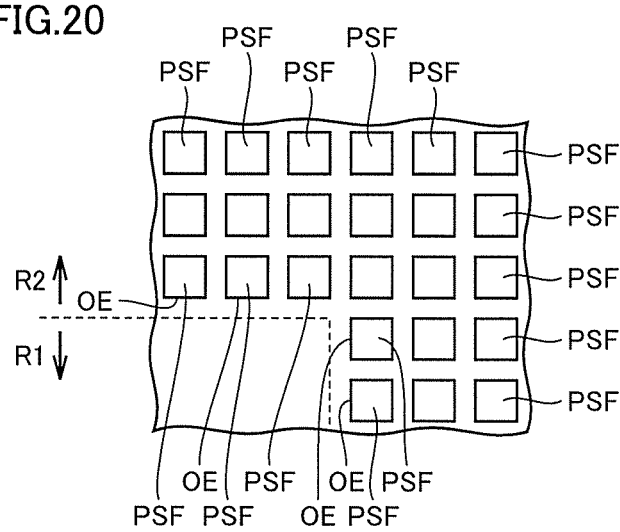
FIG. 20 is a plan view showing a variation of the methods for manufacturing the semiconductor device in accordance with the first embodiment and the second embodiment.
Figure 21:
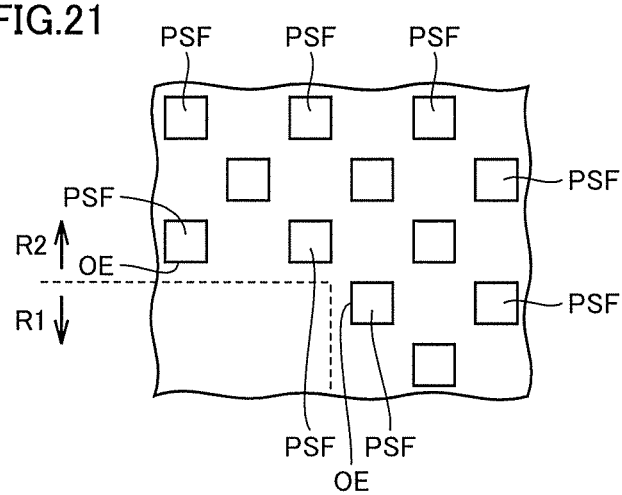
FIG. 21 is a plan view showing a variation of the methods for manufacturing the semiconductor device in accordance with the first embodiment and the second embodiment.
Figure 22:
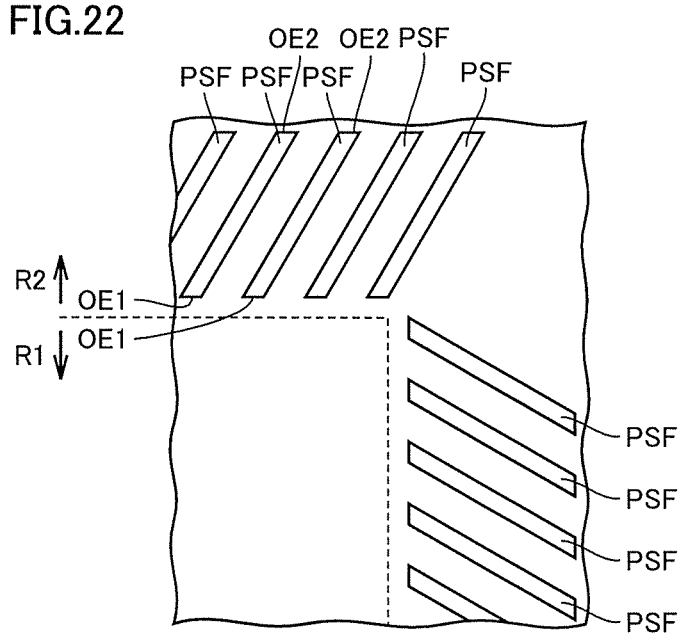
FIG. 22 is a plan view showing a variation of the methods for manufacturing the semiconductor device in accordance with the first embodiment and the second embodiment.

As shown in FIGS. 20 to 22, photosensitive film PSF may be formed to intermittently surround the periphery of first region R1 as seen in plan view.

As shown in FIG. 20, photosensitive film PSF may be intermittently formed along a peripheral direction of first region R1, and may be intermittently formed along a direction intersecting with the peripheral direction, as seen in plan view. The interval between intermittently formed photosensitive films PSF in the peripheral direction and the intersecting direction is formed to be constant, for example. As shown in FIG. 21, photosensitive film PSF may be formed in a checkered pattern as seen in plan view.

As shown in FIG. 22, photosensitive film PSF may be intermittently formed along the peripheral direction of first region R1, and may be formed to extend in a direction inclined at an angle of less than 90° with respect to the peripheral direction of first region R1, as seen in plan view. On this occasion, one end OE1 of one of adjacent photosensitive films PSF which is located closer to first region R1 and the other end OE2 of the other of adjacent photosensitive films PSF which is located more distant from first region R1 may be formed at positions aligned with each other in a direction which is along a paper plane and is vertical to the peripheral direction described above.

The film thickness of photosensitive film PSF shown in FIGS. 20 to 22 may be any thickness as long as it is more than or equal to 1.0 time the film thickness of applied film LQF, and may be more than 2.0 times the film thickness of applied film LQF. As described above, when photosensitive film PSF is formed to surround the entire periphery of first region R1 (see FIGS. 2B, 9B, and 19), the film thickness of photosensitive film PSF should be less than or equal to 2 times the film thickness of applied film LQF in order to suppress occurrence of the abnormality described above. In contrast, photosensitive film PSF as shown in FIGS. 20 to 22 can suppress the outflow of applied film LQF from first region R1 to second region R2 as compared with a case where no photosensitive film PSF is formed, as long as the film thickness of photosensitive film PSF is more than or equal to 1 time the film thickness of applied film LQF. Furthermore, photosensitive film PSF as shown in FIGS. 20 to 22 can cause a portion of applied film LQF to flow from first region R1 to second region R2 even when the film thickness is more than 2 times the film thickness of applied film LQF. Therefore, photosensitive film PSF can suppress occurrence of the abnormality described above.

The present invention is particularly advantageously applied to a method for manufacturing a semiconductor device including a region in which level difference portions are formed relatively densely, and a region in which level difference portions are formed relatively sparsely or a region in which no level difference portion is formed.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A method for manufacturing a semiconductor device, comprising the steps of: preparing a semiconductor substrate having a main surface and including a first region and a second region on the main surface, the first region being a region in which a plurality of first level difference portions are formed, the second region being a region in which a plurality of second level difference portions arranged more sparsely than the plurality of first level difference portions are formed, or a region in which no level difference portion is formed; forming a photosensitive film at least on a portion of the second region to surround a periphery of the first region as seen in plan view; forming an applied film having flowability to cover the first region and the photosensitive film, after the step of forming the photosensitive film; and removing a portion of the applied film at least on the first region; wherein in the step of preparing the semiconductor substrate, the semiconductor substrate having a coating film formed thereon is prepared, the coating film covering at least the first level difference portions, and in the step of removing the applied film, at least portions of the applied film and the coating film are removed.

2. A method for manufacturing a semiconductor device, comprising the steps of: preparing a semiconductor substrate having a main surface and including a first region and a second region on the main surface, the first region being a region in which a plurality of first level difference portions are formed, the second region being a region in which a plurality of second level difference portions arranged more sparsely than the plurality of first level difference portions are formed, or a region in which no level difference portion is formed; forming a photosensitive film at least on a portion of the second region to surround a periphery of the first region as seen in plan view; forming an applied film having flowability to cover the first region and the photosensitive film, after the step of forming the photosensitive film; and removing a portion of the applied film at least on the first region; wherein in the step of forming the applied film, the applied film is formed to cover at least the first level difference portions, and in the step of removing the applied film, at least portions of the applied film and the first level difference portions are removed.

3. The method for manufacturing the semiconductor device according to claim 1, wherein, in the step of forming the photosensitive film, the photosensitive film is cured by heat treatment or ultraviolet curing treatment.

4. The method for manufacturing the semiconductor device according to claim 1, further comprising the step of removing the photosensitive film and the applied film remaining on the main surface of the semiconductor substrate, after the step of removing the applied film.

5. The method for manufacturing the semiconductor device according to claim 1, wherein, in the step of forming the photosensitive film, the photosensitive film is formed to continuously surround an entire periphery of the first region as seen in plan view.

6. The method for manufacturing the semiconductor device according to claim 5, wherein, in the step of forming the photosensitive film, the photosensitive film is formed on the second region.

7. The method for manufacturing the semiconductor device according to claim 1, wherein, in the step of forming the photosensitive film, the photosensitive film is formed to intermittently surround the periphery of the first region as seen in plan view.

8. The method for manufacturing the semiconductor device according to claim 1, wherein a film thickness of the photosensitive film is more than or equal to 1 time and less than or equal to 2 times a film thickness of the applied film.

9. The method for manufacturing the semiconductor device according to claim 8, wherein the film thickness of the photosensitive film is more than or equal to 1 time and less than or equal to 1.5 times the film thickness of the applied film.

10. The method for manufacturing the semiconductor device according to claim 1, wherein the applied film has a viscosity of less than or equal to 100 cP.

11. The method for manufacturing the semiconductor device according to claim 10, wherein the applied film has a viscosity of less than or equal to 10 cP.

* * * * *